United States Patent [19]
Owsley et al.

[11] Patent Number: 5,396,502
[45] Date of Patent: Mar. 7, 1995

[54] SINGLE-STACK IMPLEMENTATION OF A REED-SOLOMON ENCODER/DECODER

[75] Inventors: Patrick A. Owsley; Torkjell Berge; Catherine A. French, all of Moscow, Id.

[73] Assignee: Advanced Hardware Architectures, Inc., Pullman, Wash.

[21] Appl. No.: 911,153

[22] Filed: Jul. 9, 1992

[51] Int. Cl.$^6$ .................. H03M 13/00; G06F 7/72
[52] U.S. Cl. .................. 371/37.1; 364/746.1; 364/754; 364/761
[58] Field of Search ............. 371/37.1, 37.8; 364/736, 746, 746.1, 754, 761; 341/106

[56] References Cited

U.S. PATENT DOCUMENTS

| | | | |
|---|---|---|---|
| 4,747,103 | 5/1988 | Iwamura et al. | 371/37.4 |
| 4,852,098 | 7/1989 | Brechard et al. | 371/37.1 |
| 4,918,638 | 4/1990 | Matsumoto et al. | 364/746.1 |
| 4,958,348 | 9/1990 | Berlekamp et al. | 371/37.1 |
| 5,046,037 | 9/1991 | Cognault et al. | 364/746.1 |

OTHER PUBLICATIONS

Laws, B. A. Jr. et al., "A Cellular-Array Multiplier for GF ($2^m$)", *IEEE Transactions on Computers*, Dec. 1971, pp. 1573–1578.
Wang, C. C. et al., "VLSI Architectures for Computing Multiplications and Inverses in GF ($2^m$)", *IEEE Transactions on Computers*, vol. C-34, No. 8, Aug. 1985, pp. 709–717.
Cavanagh, J. J. F., *Digital Computer Arithmetic*, McGraw-Hill Book Company, 1984, pp. 188, 192, 193.

Primary Examiner—Stephen M. Baker
Attorney, Agent, or Firm—Haverstock, Medlen & Carroll

[57] ABSTRACT

The present invention is for a Error Correction Unit (ECU) that uses a single stack architecture for the generation, reduction and evaluation of the polynomials involved in the correction of a Reed-Solomon code. The circuit uses the same hardware to generate the syndromes, reduce the $\Omega(x)$ and $\Lambda(x)$ polynomials and evaluate the $\Omega(x)$ and $\Lambda(x)$ polynomials. Some of the specifics involved in calculating and reducing the polynomials mentioned above are novel as well. First, the implementation of the general Galois field multiplier is new and faster than previous implementations. Second, the circuit for implementing the Galois field inverse function has not appeared in prior art designs. Third, a novel method of generating the $\Omega(x)$ and $\Lambda(x)$ polynomials (including alignment of these polynomials prior to evaluation) is utilized. Fourth, corrections are performed in the same order as they are received using a premultiplication step prior to evaluation. Fifth, a novel method of implementing flags for uncorrectable errors is used. Sixth, the ECU is data driven in that nothing happens if no data is present. Finally, interleaved data is handled internally to the chip.

8 Claims, 11 Drawing Sheets

| BYTE | INVERSE |
|------|---------|
| 00 | 00 |
| 01 | 01 |
| 10 | 11 |
| 11 | 10 |

FIG. 6A

TABLE 1

MSN

|     | | 1 | 0 |
|-----|---|---|---|
| LSN | 1 | 1 | 0 |
|     | 0 | 1 | 0 |

TABLE 0

MSN

|     | | 1 | 0 |
|-----|---|---|---|
| LSN | 1 | 0 | 1 |
|     | 0 | 1 | 0 |

FIG. 6B

END CELL

ECC CORE

END CELL

ECC CORE

_5,396,502_

SINGLE-STACK IMPLEMENTATION OF A REED-SOLOMON ENCODER/DECODER

FIELD OF THE INVENTION

This invention relates to the field of Reed-Solomon encoders/decoders. More particularly, this invention relates to the field of circuit enhancement of Reed-Solomon encoders/decoders to minimize hardware while maximizing performance.

BACKGROUND OF THE INVENTION

The decoding of Reed-Solomon error correcting codes requires the calculation of several polynomials with coefficients in a Galois (finite) field. These polynomials are generally known as the Syndrome polynomial, the error evaluator polynomial ($\Omega(x)$ polynomial) and the error locator polynomial ($\Lambda(x)$ polynomial). Prior art designs for computing these polynomials require a separate set of hardware, including storage elements and other circuitry, for computation of each of these polynomials, such as shown in U.S. Pat. No. 4,873,688. In addition, another set of circuitry is required for the evaluation of these polynomials during the actual correction of errors. This can be costly in terms of the required area if the decoder is implemented as part of an integrated circuit. This patent also teaches resolving the $\Omega(x)$ polynomial before calculation of the first derivative of the $\Lambda(x)$ polynomial. While this approach is valid, because the U.S. Pat. No. 4,873,688 fails to teach aligning the storage cells, the resolution is awkward.

Prior art implementations such as U.S. Pat. No. 4,873,688 search for errors in the reverse order to how they are received, which requires the use of some sort of LIFO (last in, first out). Thus, valuable time is lost while reversing the order of the bytes after correction. The U.S. Pat. No. 4,873,688 also teaches a general multiplier using feedback connections for reduction of the byte modulo p(x). These connections tend to slow the circuit down.

For determining the inverse polynomial, prior art designs have used either a shift register implementation as taught in Berlekamp, E. J., Algebraic Coding Theory, McGraw-Hill, 1968, a ROM as taught in U.S. Pat. No. 4,873,688 or a large amount of combinatorial logic for computing the inverse Patel, A. M., "on-the-fly decoder for multiple byte errors," as taught in IBM J. Res. Develop., vol. 30, no. 3, May 1986. Each of these approaches tends to utilize a large amount of surface area on an integrated circuit implementation of such a device.

SUMMARY OF THE INVENTION

The present invention is for a Error Correction Unit (ECU) that uses a single stack architecture for the generation, reduction and evaluation of the polynomials involved in the correction of a Reed-Solomon code. The circuit uses the same hardware to generate the syndromes, reduce the $\Omega(x)$ and $\Lambda(x)$ polynomials and evaluate the $\Omega(x)$ and $\Lambda(x)$ polynomials. Some of the specifics involved in calculating and reducing the polynomials mentioned above are novel as well. First, the implementation of the general Galois field multiplier is new and faster than previous implementations. Second, the circuit for implementing the Galois field inverse function has not appeared in prior art designs. Third, a novel method of generating the $\Omega(x)$ and $\Lambda(x)$ polynomials (including alignment of these polynomials prior to evaluation) is utilized. Fourth, corrections are performed in the same order as they are received using a premultiplication step prior to evaluation. Fifth, a novel method of implementing flags for uncorrectable errors is used. Sixth, the ECU is data driven in that nothing happens if no data is present. Finally, interleaved data is handled internally to the chip.

DETAILED DESCRIPTION OF THE PREFERRED EMBODIMENT

Circuit Architecture

Figure 1:
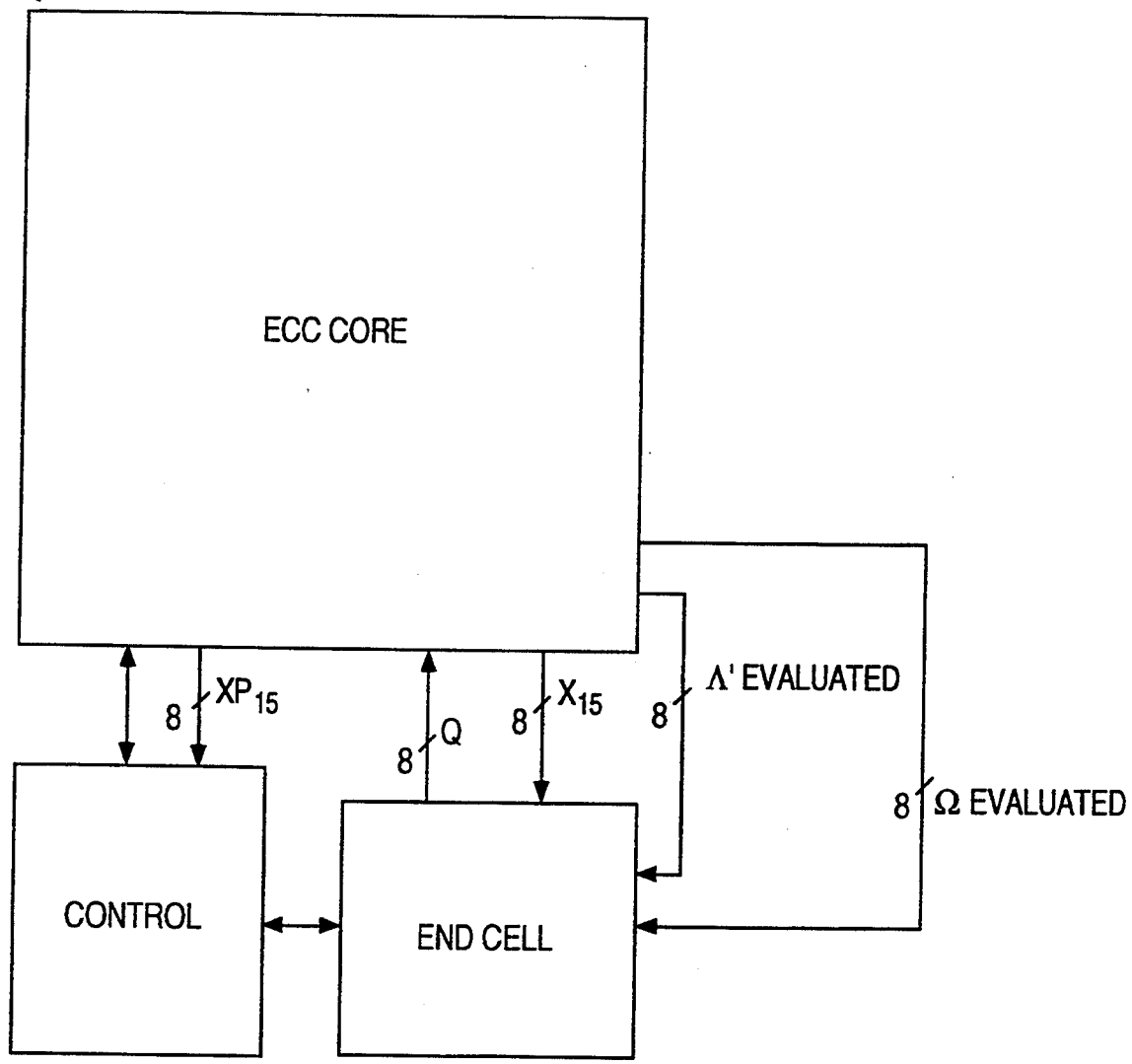
FIG. 1 is a top level block diagram of the error correction unit of the present invention. The ECU can be broken into three main blocks which are labeled ECC (error correction coding) core, control and end cell. Unless otherwise noted, the drawings given are for a Reed-Solomon code over the Galois field GF(256) that corrects up to 8 erroneous bytes per code block, and thus requires 16 bytes of parity.

FIG. 1 shows a block diagram of the present invention. A control circuit 22 is coupled to control a single ECC core 20 and an end cell 24. In the preferred embodiment, the end cell 24 is coupled via an 8 bit bus to provide a byte Q (a field element of the Galois Field) to the ECC core 20. The ECC core 20 first calculates the syndrome in register X and is coupled to provide that polynomial to both the control circuit 22 and the end cell 24. The ECC core 20 then calculates the $\Omega(x)$ polynomial and is coupled to provide that result to the end cell 24. The $\Omega(x)$ polynomial is then premultiplied and stored prior to the generation of the first derivative of the $\Lambda(x)$ polynomial within the ECC core 20.

Figure 2:
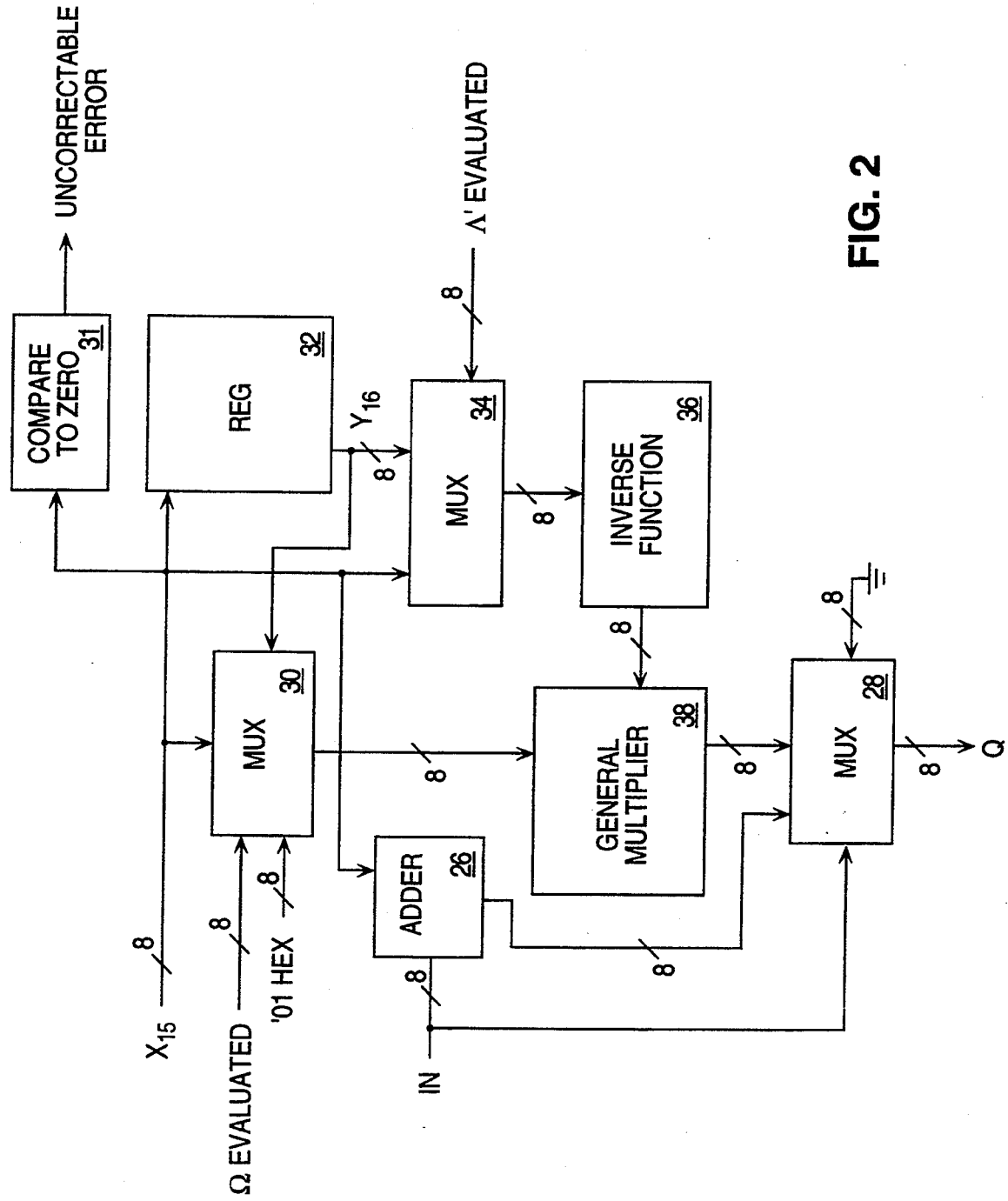
FIG. 2 is a more detailed block diagram of the end cell block of the error correction unit.

FIG. 2 shows a block diagram of the end cell 24 (FIG. 1). Recall that the end cell 24 is configurable to perform a variety of functions; not all of the connections shown are active when performing each function. The connections as configured for performing the functions are shown in more detail in FIGS. 7 through 10. All the couplings described relative to the figures are made via eight bit busses except FIGS. 5 and 6.

An input Reed-Solomon byte IN is coupled to an adder 26 and a multiplexor 28. The output of the multiplexor 28 is the byte Q. The multiplexor 28 is also coupled to receive an input from ground for providing an input of all zeroes.

A register containing the byte $X_{15}$ is coupled to the adder 26, a multiplexor 30, a register 32 and another multiplexor 34. The output of the register 32, the byte $Y_{16}$, is coupled to the multiplexor 30 and the multiplexor 34. The output of the multiplexor 34 is coupled to the inverse function circuit 36. The output of the inverse function circuit 36 and the output of the multiplexor 30 are each coupled to a general multiplier 38. The output of the general multiplier 38 and the adder 26 are each coupled to the multiplexor 28. During the various stages of operation of the system, the evaluated $\Omega(x)$ polynomial and the constant 01H are coupled to the multiplexor 30. Additionally, the evaluated $\Lambda'(x)$ polynomial is coupled to the multiplexor 34.

Figure 3:
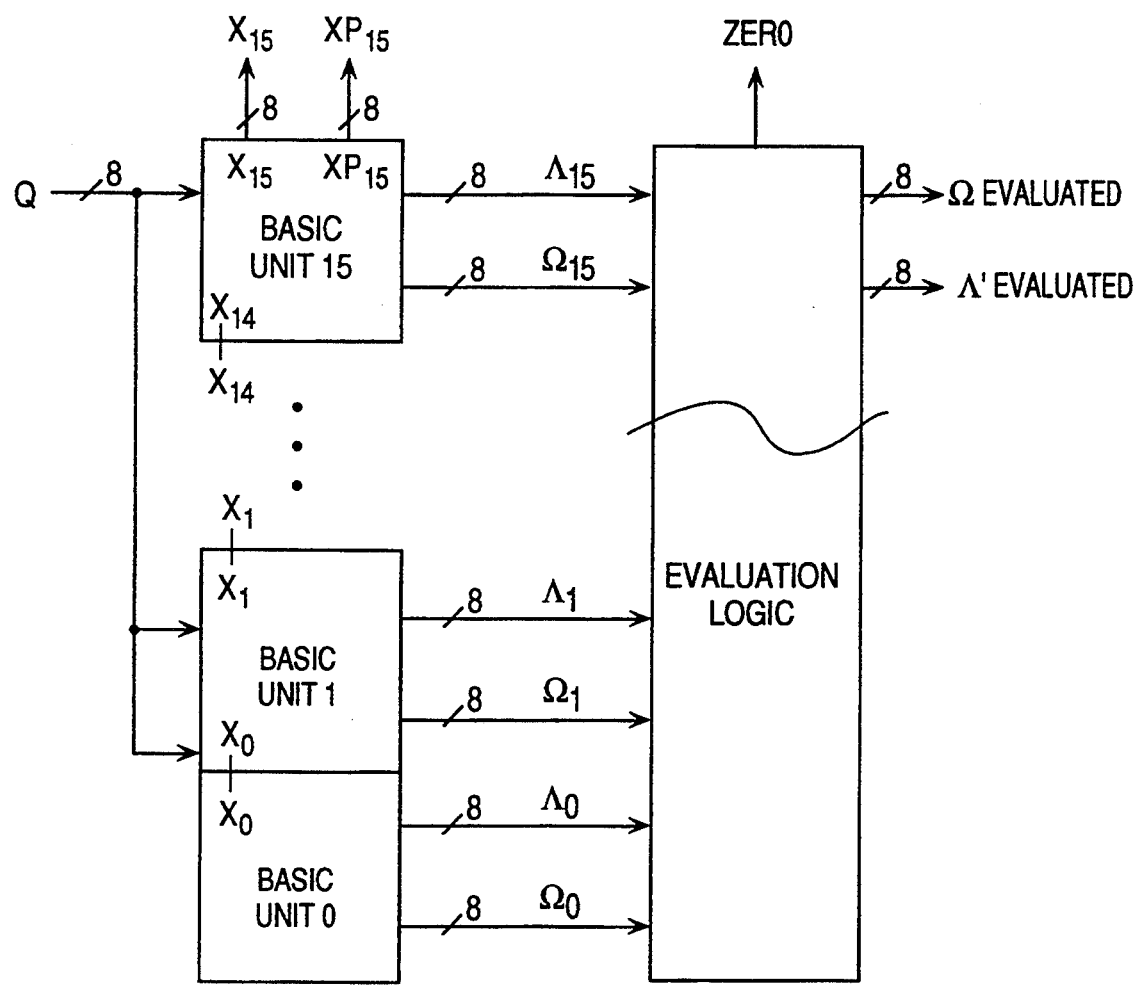
FIG. 3 is a block diagram of the error correction core of the present invention.

FIG. 3 shows a more detailed block diagram of the ECC core 20 (FIG. 1). The byte Q is coupled to sixteen basic units 40, 42 . . . 44 eight bits at a time (the circuit of the preferred embodiment is configured for GF(256)). Each basic unit i has an input Q and three outputs $X_i$, $\Lambda_i$ and $\Omega_i$. Each basic unit i also coupled to receive the $X_{i-1}$ output except basic unit 0 40 which has only one input Q. The basic unit 15 has an additional output $XP_{15}$. Each of the basic unit outputs $\Lambda_i$ and $\Omega_i$ is coupled to an evaluation logic circuit 46 which has three outputs including the evaluated $\Omega(x)$ polynomial, the evaluated $\Lambda'(x)$ polynomial and zero.

Figure 4:
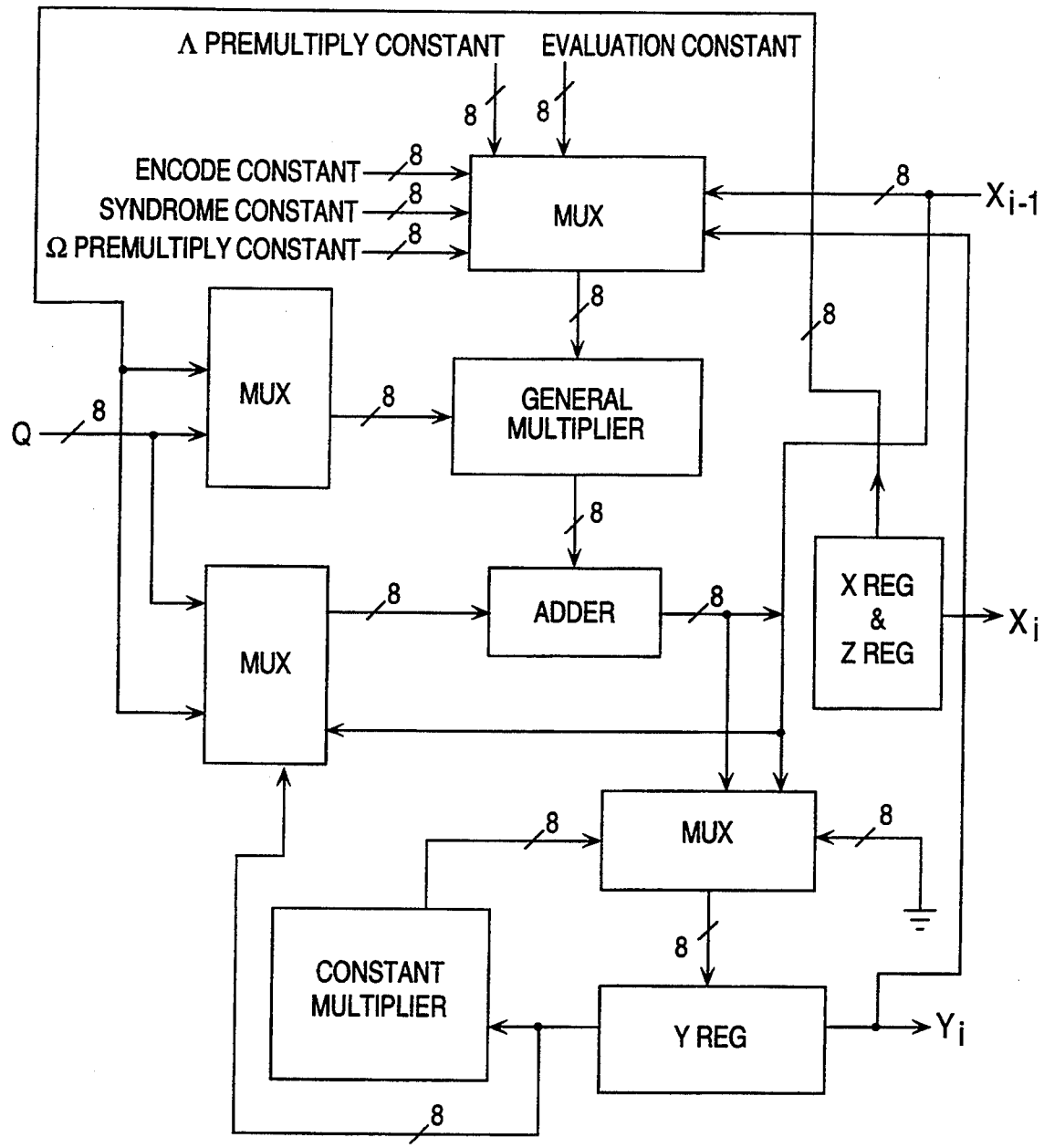
FIG. 4 is a block diagram of the basic unit of the error correction core.

FIG. 4 shows a more detailed block diagram of the basic unit i. An eight bit byte Q is coupled as an input to two multiplexors 50 and 52 from the end cell 24 (FIG. 1). Another multiplexor 54 is coupled to receive an evaluation constant, a $\Lambda(x)$ premultiply constant, an encode constant, a syndrome constant, an $\Omega(x)$ premultiply constant and (for all but the basic unit 0 40 (FIG. 3)) the $X_{i-1}$ output. The $X_{i-1}$ output is also coupled as inputs to the multiplexor 52 and a multiplexor 60. The outputs of two multiplexors 50 and 54 are coupled to provide input data to a general multiplier 56. The output of the multiplexor 52 and of the general multiplier 56 are coupled as inputs to an adder 58.

The output of the adder 58 is coupled as an input to the multiplexor 60 and to X and Z registers 62. The output of the X register is the $X_i$ output discussed above. The output of the X or Z register is coupled as an input to the two multiplexors 50 and 52. The multiplexor 60 is also coupled to receive the output of a constant multiplier 66 and a zero input. The output of the multiplexor 60 is coupled as an input to a Y register 64. The contents of the Y register 64 $Y_i$ is coupled as an input to the two multiplexors 52 and 54 and to the constant multiplier 66.

Figures 5A, 5B:
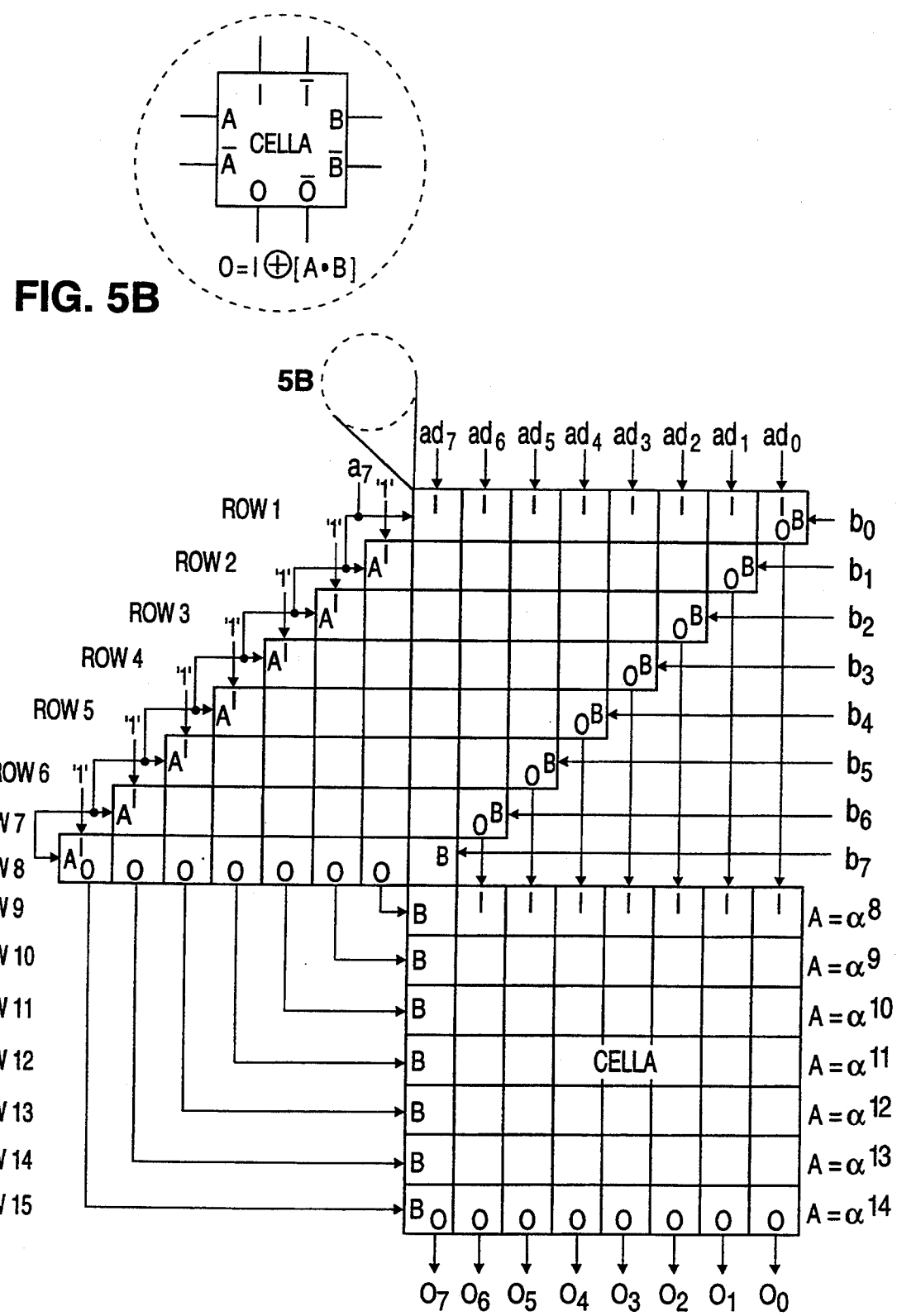
FIG. 5 is a block diagram of the general Galois field multiplier circuit of the present invention including a blow up of a single cell of the multiplier.

FIG. 5 shows a block diagram of the general multiplier 56 for the special case of m=8 (i.e., 8-bit bytes). It should be clear to a person skilled in the art how this Figure would change for other values of m. While the physical structure of the general multiplier is non-directional, some of the descriptions herein are related to the orientation of the drawing.

FIG. 5 also shows an expanded view of a single CellA 70. Each cell has six inputs, A, B, I and each of their respective complements. Each cell includes three inverters to form the respective complements. Also, each cell has two outputs, O and its complement. The output O is equal to the exclusive OR of the I input with the AND of the A and B inputs, i.e., $O = I \oplus [A \cdot B]$.

This general multiplier 56 is a new high-speed general multiplier circuit and is a component of the basic unit making up the ECC core 20 (FIG. 1). The inputs to the multiplier are the two eight bit field elements to be multiplied. In polynomial form, these elements are represented as $$a(x) = a_7 x^7 + a_6 x^6 + \ldots + a_1 x + a_0$$

and $$b(x) = b_7 x^7 + b_6 x^6 + \ldots + b_1 x + b_0$$

Where the $a_i$ and $b_i$ are binary numbers. The multiplier performs a Galois field multiplication of two field elements based on a primitive polynomial, p(x). In addition, the circuit allows for the Galois field addition of a third input given by $$ad(x) = ad_7 x^7 + ad_6 x^6 + \ldots + ad_1 x + ad_0$$

The A inputs for all the rows 1 through 7 are the coefficients of a(x) starting with $a_7$ on the left as the A input to the cell 80 (that connection is shown). Similarly, the input to the cell 82 is $a_6$, the input to the cell 84 is $a_5$ and so on. The A inputs for rows 9,10, . . . , 15 are the coefficients of the Galois field elements $\alpha^8$, $\alpha^9$, . . ., $\alpha^{14}$ respectively, with the high order coefficient on the left. All the I inputs not shown in the drawing are connected to the O outputs of the cells immediately above. Thus, the I input to cell 86 is the O output from the cell 88 above it.

The B inputs to rows 1, 2, . . . , 8 are $b_0$, $b_1$, . . . , $b_7$, respectively. All other input/output connections are shown. The result of the multiply and add corresponds to the outputs of the cells in row 15. Mathematically, this output is given by $$o(x) = [a(x)b(x) + ad(x)] \text{ modulo } p(x).$$

The top half of this multiplier circuit is similar to the general multiplier described in U.S. Pat. No. 4,873,688, except that the circuit in U.S. Pat. No. 4,873,688 contains feedback connections for reduction of the byte modulo p(x). These connections tend to slow the circuit down. Instead of feedback connections, the implementation of the present invention accomplishes the multiplication with a preprogrammed section after the multiply but before the reduction modulo p(x). The connections in this section of the circuit are determined by the 1's in $\alpha^8$, $\alpha^9$, . . . , $\alpha^{14}$, where $\alpha$ is the primitive element of the field. This assumes 8-bit symbols (bytes), although it could easily be generalized. This preprogramming allows the circuit to operate faster than the prior art design.

FIG. 6 shows a circuit for performing the Galois Field inverse function. The circuit in the preferred embodiment, performs the inverse function using two-levels of multiplexing, making the circuit fast and efficient in terms of chip area. Construction of the inverse circuit is best described using an example. The example will illustrate the case of GF(4), or the Galois Field with four elements (using GF(256), as in the preferred embodiment, would obscure this feature of the invention in unnecessary complexity). The elements of GF(4) are represented as 2-bit bytes, the elements and their inverses are as shown in FIG. 6(a). Note that the inverse of 00 is forced to be 00 (since 00 really has no inverse).

While the above equations have been used to illustrate the case of GF($2^8$), generalized equations for a general value of m, in polynomial form for the three inputs are represented as $$a(x) = a_{m-1}x^{m-1} + a_{m-2}x^{m-2} + \ldots + a_1x + a_0;$$

$$b(x) = b_{m-1}x^{m-1} + b_{m-2}x^{m-2} + \ldots + b_1x + b_0;$$

and $$ad(x) = ad_{m-1}x^{m-1} + ad_{m-2}x^{m-2} + \ldots + ad_1x + ad_0$$

where $a_i$, $b_i$ and $ad_i$ are binary numbers.

A set of tables is constructed for this example, one table for every bit in the byte, based on the inverse table. In this case, there are two bits per byte, thus there will be two tables. For eight-bit bytes, eight tables would be needed. To construct each table, the byte to be inverted is broken into two "nibbles" which are designated the most significant nibble (MSN), and the least significant nibble (LSN).

A two-bit byte would have a one-bit nibble, whereas an eight-bit byte would have a four-bit nibble. The MSN is listed along the top of the table, and the LSN is listed along the left of the table. This is shown for GF(4) in FIG. 6(b). The range of values for the nibbles is from 0 to 1 for GF(4), and is 0 to 15 for GF(256). The entries in table i correspond to bit number i in the inverse of the byte being considered. For example, if Table 0 is being constructed and if the byte being inverted was 10, then MSN=1 and LSN=0. Since the inverse of 10 is 11, bit 0 (the last bit) is considered of 11 to obtain the entry for MSN=1 and LSN=0 in table 0. In this case, the last bit is a 1. Other entries are obtained in a similar fashion and the results are given in FIG. 6(b).

Figures 6C, 6D:
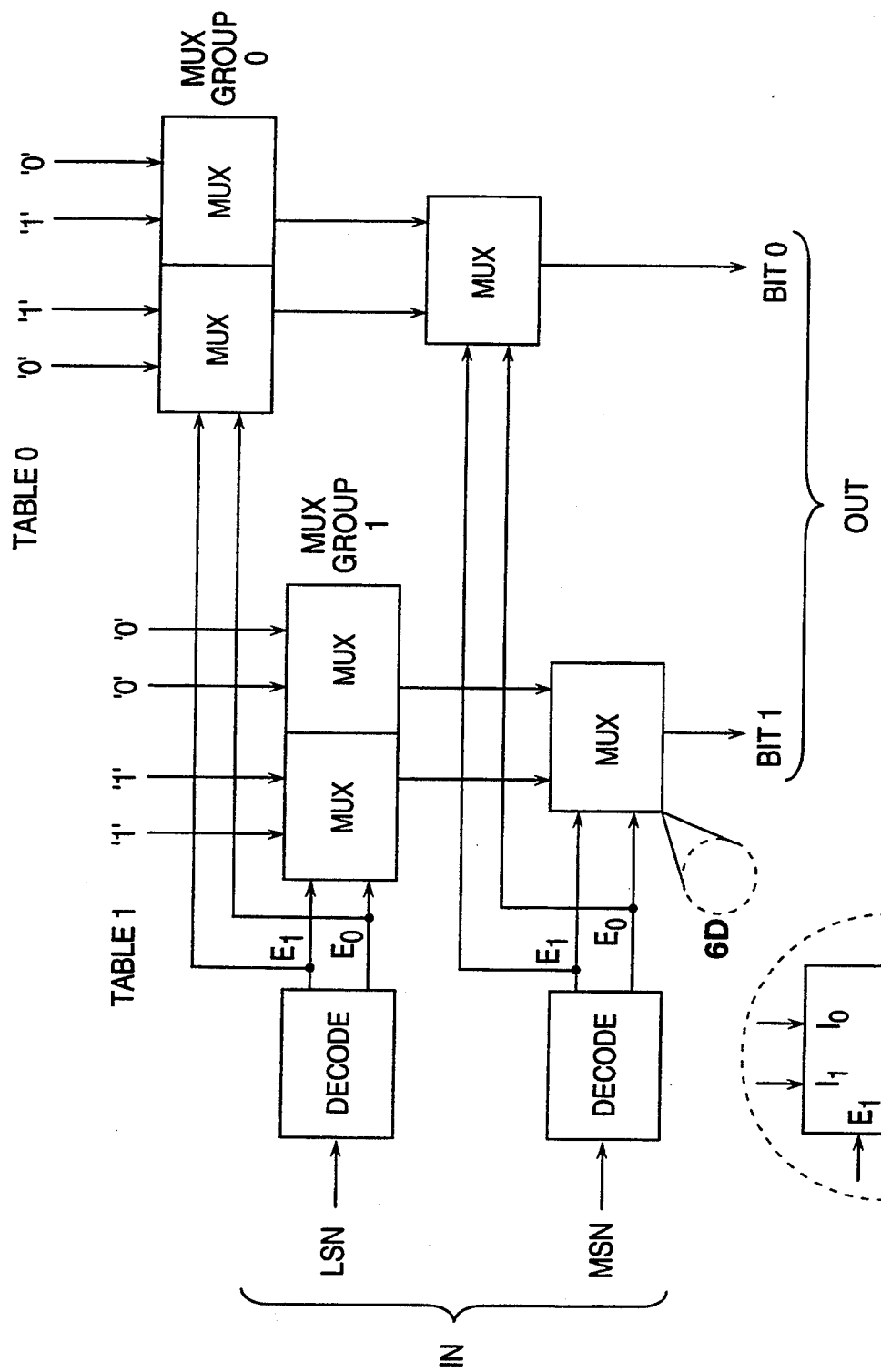
FIG. 6 is a block diagram of the Galois field inverse circuit including inverse tables. For simplicity, the inverse circuit is given for GF(4) instead of GF(256).

Once these tables are constructed, they are used to program a set of multiplexors as shown in FIG. 6(c). Note that two levels of multiplexing are required. In the example using GF(4) there are six multiplexors 90, 92, 94, 96, 100 and 102. FIG. 6(c) shows an expanded view of one of the six multiplexors, each of which is identical. Each individual multiplexor has two with inputs $I_1$ and $I_0$ which are chosen depending on the state of the inputs $E_1$ and $E_0$, respectively, resulting in the output O. The number of I and E inputs for GF(256) would be 16 of each.

The input data to the inverse circuit is LSN and MSN which are determined as described above for the byte to be inverted. The LSN nibble is coupled to a decoder 104 that generates an appropriate output depending upon the data in the LSN. The outputs of the decoder 104 are coupled to the E0 and E1 inputs of the first level of multiplexors 90, 92, 94 and 96. The $I_0$ and $I_1$ inputs of the group 0 of the first level of multiplexors 90 and 92 are determined by the table data for table 0 of FIG. 6(b). Similarly, the $I_0$ and $I_1$ inputs of the group 1 of the first level of multiplexors 94 and 96 are determined by the table data for table 1 of FIG. 6(b).

The MSN nibble is coupled to a decoder 106 that generates an appropriate output depending upon the data in the MSN. The outputs of the decoder 106 are coupled to the E0 and E1 inputs of the second level of multiplexors 100 and 102. The $I_0$ and $I_1$ inputs of the first multiplexor 102 of the second level of multiplexors are determined by the outputs O of the group 0 multiplexors, 96 and 94, respectively. Similarly, the $I_0$ and $I_1$ inputs of the second multiplexor 100 of the second level of multiplexors are determined by the outputs O of the group 1 multiplexors, 92 and 90, respectively. For both decoders 104 and 106, each nibble is decoded to a string of bits where only one bit is high depending on the nibble. Finally, the outputs of the second level multiplexors 100 and 102 are the bits in the inverse byte. For GF(256) there would be eight multiplexor groups in the first level with 16 multiplexors per group and eight single multiplexors in the second level.

Figure 7A:
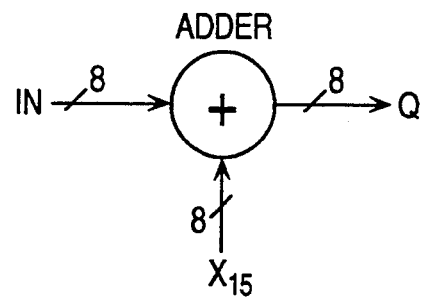
FIG. 7 is a more detailed block diagram of portions of the multiplexor circuit for the end cell and the ECC core during the encoding function.
Figure 7B:
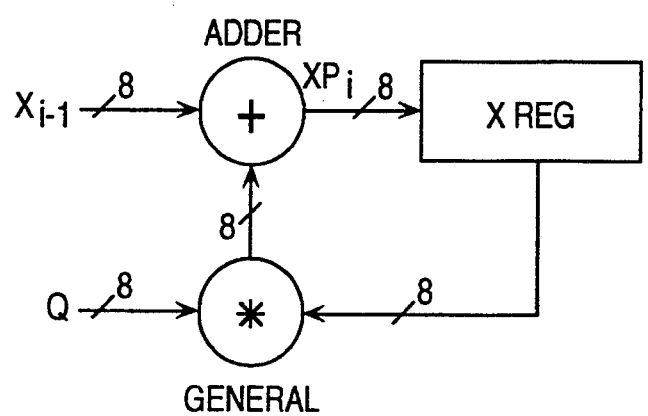

The circuits of the ECC core 20 and the end cell 24 (FIG. 1) are configurable under control of the control circuit 22 for performing the various functions necessary to resolve the encoding and decoding of the present invention. In particular, FIG. 7 shows the connections for encoding data according to the present invention. In the end cell, the output Q is the sum of the input data IN and the contents of the register $X_{15}$. As discussed above relative to FIG. 2, the two input values are each coupled to the adder 26. The sum from the adder 26 is coupled through the multiplexor 28 as the output Q. In each basic unit 40, 42 . . . 44 of the ECC core 20, the contents of the X register 62 and the Q data from the end cell 24 are each coupled to the general multiplier 56. The output of the general multiplier is coupled to the adder 58 and is summed with contents of the $X_{n-1}$ register which is coupled to the adder through the multiplexor 52. The sum is coupled into the X register 62 from the adder 58.

Figure 8A:
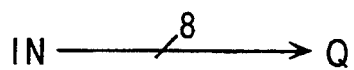
FIG. 8 is a more detailed block diagram of portions of the multiplexor circuit for the end cell and the ECC core during the Syndrome Generation function.
Figure 8B:
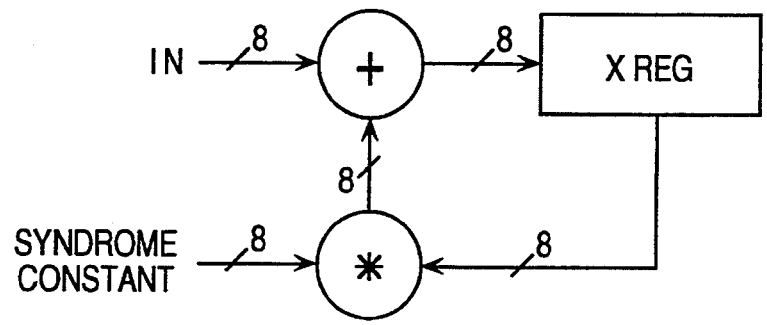

FIG. 8 is similarly used to show the connections necessary in the ECC core 20 and the end cell 24 for generating syndromes. In the end cell 24, the input data IN is coupled directly to the output through the multiplexor 28. In each basic unit 40, 42 . . . 44 of the ECC core 20, the multiplexor 54 couples the syndrome constant and the multiplexor 50 couples the contents of the X register 62 to the general multiplier 56 for forming a product. The input Q (which is the input data IN for syndrome generation) is coupled to the adder 58 through the multiplexor 52 to be added with the product output from the general multiplier 56. The sum output of the adder 58 is coupled to replace the contents of the X register 62.

Figure 9A:
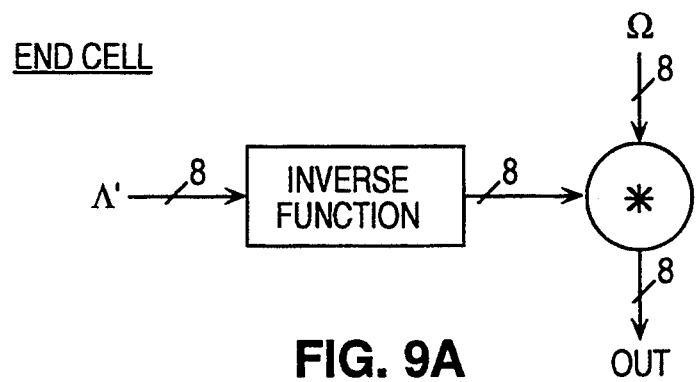
FIG. 9 is a more detailed block diagram of portions of the multiplexor circuit for the end cell and the ECC core during the evaluation function.
Figure 9B:
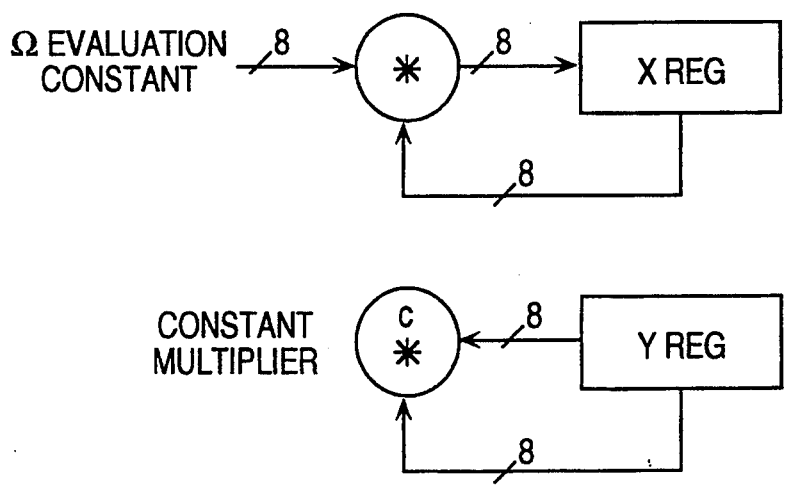

FIG. 9 shows the connections which are necessary for evaluating the $\Omega(x)$ and $\Lambda(x)$ polynomials. In the end cell 24, the $\Lambda'(x)$ polynomial is coupled to the inverse function circuit 36 through the multiplexor 34. The result of the inversion is coupled to the general multiplier 38. The polynomial $\Omega(x)$ is also coupled to the general multiplier 38 through the multiplexor 30 for forming a product which is the output Q of the end cell 24 through the multiplexor 28. In the ECC core 20, the contents of the Y register 64 are multiplied by a constant in the constant multiplier 66 which product then replaces the contents of the Y register 64. The multiplexor 54 couples the $\Omega$ constant the general multiplier 56. The contents of the X register are also coupled to the general multiplier 56 through the multiplexor 50 for forming a product with the $\Omega$ constant. The product of the general multiplier 56 is coupled to replace the contents of the X register 62.

Figure 10A:
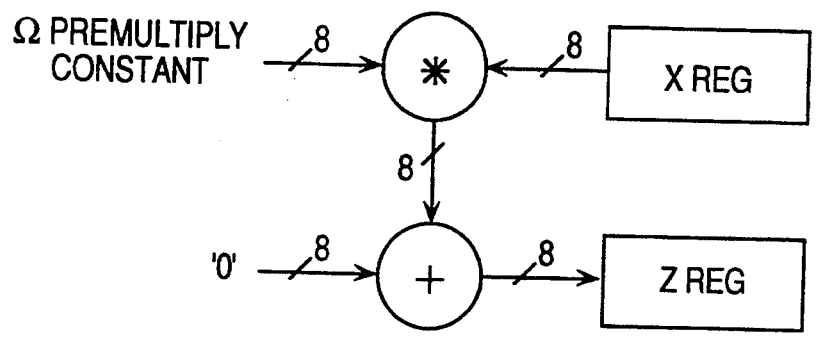
FIG. 10 is a more detailed block diagram of portions of the multiplexor circuit for the ECC core during the premultiplication function for $\Omega$ and $\Lambda$.

FIG. 10(a) shows the connections in the ECC core 20 for the premultiplication of the $\Omega(x)$ polynomial. The premultiplication step is necessary for the evaluation of the $\Omega(x)$ polynomial that is performed by the connections described above relative to FIG. 9. The $\Omega$ premultiply constant is coupled to the general multiplier 56 through the multiplexor 54. Also, the contents of the X register are coupled to the general multiplier 56 through the multiplexor 50 and is multiplied by the Ω premultiply constant to form a product. The product is coupled to the adder 58 and is added to "0". The sum output of the adder 58 is coupled for storage in the Z register 62.

Figure 10B:
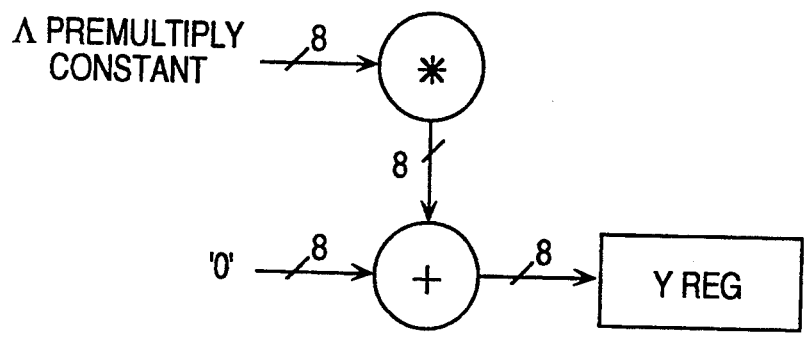

FIG. 10(b) shows the connections in the ECC core 20 for the premultiplication of the Λ(x) polynomial. The premultiplication step is necessary for the evaluation of the Λ(x) polynomial that is performed by the connections described above relative to FIG. 9. The Λ premultiply constant is coupled to the general multiplier 56 through the multiplexor 54 and is multiplied by the contents of the X register 62 in the general multiplier 56 to form a product. The product is coupled to the adder 58 and is added to "0". The sum output of the adder 58 is coupled through the multiplexor 60 and stored in the Y register 64.

Circuit Operation

In the preferred embodiment, a single Euclid stack is utilized for resolving the polynomials. The circuitry is reconfigurable as described above to initialize it for performing each of the intended functions. The computations are carried out in sequence, with the circuitry initialized according to which polynomial is being computed.

Thus, all calculations are made utilizing a single set of storage elements, Galois field adders, Galois field multipliers and multiplexors (FIG. 4) for the high-speed computation of all three polynomials and for the evaluation of the polynomials during correction. In addition, the connections of the multiplexors are modified as shown in FIGS. 7–10 to configure the circuitry depending on which operation is occurring.

The syndrome polynomial is computed first in the X register 62 (FIG. 4) (with multiplexor connections as shown in FIG. 8) and is then used as the initial condition for computation of the Omega polynomial. Thus, the syndrome does not have to be stored into another memory location after computation because the resolution of the Ω(x) polynomial uses the syndrome in the X register 62. Next, the Ω(x) polynomial is computed in the X register 62 using Euclid's algorithm, and is premultiplied and stored in the Z register 62 for evaluation. The premultiply is required so that during evaluation, the error locations can be tested in the same order that the symbols entered the decoder. The premultiply constants for the Ω(x) polynomial are given by $\alpha^{-(n-1)(i+j_0)}$ where n is the block length, i is the position in the stack and $\alpha^{j_0}$ is the first root of the code generator polynomial, $g(x)$. That is, $$g(x) = \prod_{j=0}^{n-k-1} (x - \alpha^{j_0+j})$$

where k is the information length.

The steps required to compute the Ω(x) polynomial are also stored as they occur so that they can be repeated for computing the Λ(x) polynomial. The Λ(x) polynomial is then computed in the X register and then premultiplied and stored in the Y register. The premultiply constants for the Λ(x) polynomial are $\alpha^{-(n-1)(i+1)}$. The multiplexor connections for the computation of Ω(x) and Λ(x) polynomials are the same as described in U.S. Pat. No. 4,873,688 filed Oct. 5, 1987 and issued Oct. 10, 1989 to Maki, et al., which is incorporated herein by reference.

During computation, the Λ(x) polynomial is aligned such that the first derivative of Λ(x), Λ'(x), is in the same storage cell position as the stored Ω(x) polynomial. After both polynomials are generated, the Ω(x) polymonial is moved to the X register and the Λ(x) is in the Y register. Because the polynomials are aligned, the resolution of the errors only requires a single set of premultiply constants for each polynomial.

Once the Ω(x) and Λ(x) polynomials have been found, premultiplied and aligned as described above, the errors, if any, are located by finding the roots of the Λ(x) polynomial. The connections for configuring the ECC core 20 to perform this step are shown in FIG. 9. The first derivative of Λ(x), Λ'(x), is coupled to an inverse function circuit 36. The errors are searched for in the order received rather than in reverse order as taught in U.S. Pat. No. 4,873,688 thereby avoiding the necessity of LIFO (last in, first out) circuitry. Errors are searched for beginning with the first byte of the Reed-Solomon codeword that was received for decoding. This is accomplished by adjusting the Λ(x) and Ω(x) polynomials using a premultiply stage prior to evaluation. The connections required for premultiplication are shown in FIG. 10.

When errors are found (i.e., when a root of the Λ(x) polynomial occurs), the error values are immediately available. Correctable errors are corrected by exclusive-oring the error values with the received bits in the current byte.

The entire ECU is data driven. This means that no calculations are performed when no data is present. This in turn implies that the circuitry remains in a low-power mode when it is not being used, thus limiting the loading of the power source. This is important if, for example, the system is powered using a battery.

The preferred embodiment of the present invention also handles interleaved data internally. Interleaving is useful in randomizing errors that occur in bursts, so that the Reed-Solomon code can handle them. To facilitate the interleaving, the X and Z registers 62 and the Y register 64 are each I registers deep where I is the interleave depth. The control circuit 22 (FIG. 1) determines which of the I registers to select. Prior designs of interleavers generally require some kind of buffer management along with external RAM, both of which are eliminated by this invention.

The ECU described above is also used for encoding of the data in addition to the decoding function. This eliminates the need for a separate encoder circuit. The connections in the ECC core 20 and the end cell 24 are shown in FIG. 7.

What is claimed is:

1. A Reed-Solomon Euclid's Algorithm error correction circuit for resolving a syndrome polynomial, an Ω(x) polynomial, a Λ(x) polynomial and a Λ'(x) polynomial, each of these polynomials having a plurality of coefficients, the circuit having a plurality of cells wherein each cell is selectively controllable for first resolving one coefficient of the syndrome polynomial, then a corresponding coefficient of the Ω(x) polynomial, followed by a corresponding coefficient of the Λ(x) polynomial further wherein the Λ'(x) polynomial is extracted from the Λ(x) polynomial.

2. The circuit according to claim 1 wherein the Ω(x) polynomial is stored in a first storage cell having a plurality of first storage cell first positions and the Λ'(x)

polynomial is aligned in a second storage cell having a plurality of second storage cell second positions wherein each first position has a corresponding second position, such that the polynomials are aligned in corresponding ones of the first positions and second positions.

3. The circuit according to claim 1 wherein the polynomials have a plurality of data bytes and are resolved one byte at a time, and further wherein, errors are corrected in the order in which the bytes are received by the circuit.

4. The circuit according to claim 1 further comprising automatic means for activating the circuit only while data is present.

5. A two stage general Galois field multiplier for multiplying a first Galois field polynomial number $a(x)$ having a form $$a(x) = a_{m-1}x^{m-1} + a_{m-2}x^{m-2} + \ldots + a_i x^i + \ldots + a_1 x + a_0$$

by a second Galois field polynomial number $a(x)$ having a form $$b(x) = b_{m-1}x^{m-1} + b_{m-2}x^{m-2} + \ldots + b_j x^j + \ldots + b_1 x + b_0$$

for forming a Galois field product in a Galois field having field elements $0, \alpha^0, \alpha^1$ through $\alpha^{2m-2}$, the multiplier comprising:

a. a plurality of multiply cells, each cell having:
  (1) six inputs including input A, input B and input I as well as the complement of each of these inputs;
  (2) two outputs including output O and its complement; and
  (3) logic circuit means for combining the inputs so that $O = I \oplus (A \cdot B)$;
b. a first logic stage having m rows, including row j: $j = 1, \ldots, m$, each row having m of said cells, including cell i: $i = m-1, \ldots, 0$ such that:
  (1) each cell in the jth row has a B input of $b_{j-1}$;
  (2) the ith cell in each row has an A input of $a_i$;
  (3) the rows are arranged such that the output O of each cell i in a row j is coupled to the I input of the cell $i-1$ in the row $j+1$; and
c. a second logic stage having $m-1$ rows, including row j: $j = m+1, \ldots, 2m-1$, each row having m of said cells, including cell i: $i = m-1, \ldots, 0$, such that:
  (1) the output O of each cell i in each row j is coupled to an I input of cell i in row $j+1$;
  (2) the output O of each cell except cell 0 in the row m of the first multiply stage is coupled to all the B inputs of one row in the second multiply stage such that the output O of the cell i is coupled to all the B inputs of the row $m+i$; and
  (3) the A inputs to all the cells in row $m+1$ are the coefficient of the Galois field element $\alpha^m$, the A inputs to all the cells in row $m+2$ are the coefficients of the Galois field element $\alpha^{m+1}$ and so on;

wherein the output of the circuit is equal to $$o(x) = (a(x)b(x)) \text{ modulo } p(x).$$

6. The multiplier according to claim 5 further comprising means for adding a third input having the form $$ad(x) = ad_{m-1}x^{m-1} + ad_{m-2}x^{m-2} + \ldots + ad_1 x + ad_0$$

wherein the coefficients of $ad(x)$ are coupled to the I inputs of row 1 such that $ad_0$ is coupled to the I input of cell 0 in row 1, $ad_1$ is coupled to the I input of cell 1 in row 1 and so on.

7. An inverse circuit for a Reed-Solomon decoder for a Galois field $GF(2^m)$, the inverse circuit for forming an inverted byte corresponding to an input byte comprising:

a. a plurality of multiplexors, each multiplexor having a first set of $2^{m/2}$ inputs, a second set of $2^{m/2}$ inputs and an output;
b. a first multiplexor level having m multiplexor groups, each group containing $2^{m/2}$ of said plurality of multiplexors, wherein a predetermined signal is coupled to each of the first set of inputs according to known inverse values of the Galois field, and a first set of $2^{m/2}$ byte signals is coupled to each of the second set of inputs according to a logic state of a Galois field byte being inverted; and
c. a second multiplexor level having m of said plurality of multiplexors, wherein each input of the first set of inputs is coupled to receive a corresponding output from a multiplexor in the first multiplexor level and a second set of $2^{m/2}$ byte signals is coupled to each of the second set of inputs according to the logic state of the Galois field byte being inverted.

8. The inverter according to claim 7 further comprising a first decoder having m/2 inputs for forming the first set of $2^{m/2}$ byte signals and a second decoder having m/2 inputs for forming the second set of $2^{m/2}$ byte signals.

* * * * *